US012321101B2

(12) United States Patent
Pisarenco et al.

(10) Patent No.: US 12,321,101 B2
(45) Date of Patent: Jun. 3, 2025

(54) METHOD FOR APPLYING A DEPOSITION MODEL IN A SEMICONDUCTOR MANUFACTURING PROCESS

(71) Applicant: ASML NETHERLANDS B.V., Veldhoven (NL)

(72) Inventors: Maxim Pisarenco, Son en Breugel (NL); Maurits Van Der Schaar, Eindhoven (NL); Huaichen Zhang, Eindhoven (NL); Marie-Claire Van Lare, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 507 days.

(21) Appl. No.: 17/621,494

(22) PCT Filed: Jun. 4, 2020

(86) PCT No.: PCT/EP2020/065400
§ 371 (c)(1),
(2) Date: Dec. 21, 2021

(87) PCT Pub. No.: WO2021/001109
PCT Pub. Date: Jan. 7, 2021

(65) Prior Publication Data
US 2022/0350254 A1    Nov. 3, 2022

Related U.S. Application Data

(60) Provisional application No. 62/870,432, filed on Jul. 3, 2019.

(51) Int. Cl.
*G03F 7/00*        (2006.01)
(52) U.S. Cl.
CPC ......... *G03F 7/705* (2013.01); *G03F 7/70633* (2013.01)

(58) Field of Classification Search
CPC . H01L 2224/743; H01L 24/743; G03F 7/705; G03F 7/70633; G03F 7/70683; G03F 9/708
See application file for complete search history.

(56) References Cited

U.S. PATENT DOCUMENTS 6,046,792 A    4/2000  Van Der Werf et al.
6,077,756 A *  6/2000  Lin ......................... H01L 22/34
                                                     257/797

(Continued)

FOREIGN PATENT DOCUMENTS

JP    2014526805    10/2014
JP    2017537352    12/2017

(Continued)

OTHER PUBLICATIONS

Office Action issued in corresponding Korean Patent Application No. 10-2022-7000106, dated Oct. 16, 2023.

(Continued)

*Primary Examiner* — Vincent H Tran
(74) *Attorney, Agent, or Firm* — Pillsbury Winthrop Shaw Pittman, LLP

(57) ABSTRACT

A method for applying a deposition model in a semiconductor manufacturing process. The method includes predicting a deposition profile of a substrate using the deposition model; and using the predicted deposition profile to enhance a metrology target design. The deposition model can be calibrated using experimental cross-section profile information from a layer of a physical substrate. In some embodiments, the deposition model is a machine-learning model, and calibrating the deposition model includes training the machine-learning model. The metrology target design may include an alignment metrology target design or an overlay metrology target design, for example.

20 Claims, 14 Drawing Sheets

(56) References Cited

U.S. PATENT DOCUMENTS

| | | | | |
|---|---|---|---|---|
| 6,192,330 | B1* | 2/2001 | Nakamura | G06F 30/23 |
| | | | | 703/2 |
| 6,961,116 | B2 | 11/2005 | Den Boef et al. | |
| 7,873,504 | B1* | 1/2011 | Bevis | G03F 1/36 |
| | | | | 356/252 |
| 8,479,125 | B2* | 7/2013 | Pierrat | G03F 7/70125 |
| | | | | 716/54 |
| 8,832,611 | B2 | 9/2014 | Liu et al. | |
| 9,804,504 | B2 | 10/2017 | Chen et al. | |
| 11,640,116 | B2 | 5/2023 | Den Boef et al. | |
| 2003/0048458 | A1* | 3/2003 | Mieher | G03F 7/70641 |
| | | | | 356/624 |
| 2003/0163295 | A1* | 8/2003 | Jakatdar | G06F 30/20 |
| | | | | 703/14 |
| 2005/0209818 | A1* | 9/2005 | Chao | G03F 7/70525 |
| | | | | 702/182 |
| 2006/0066855 | A1 | 3/2006 | Boef et al. | |
| 2007/0276634 | A1* | 11/2007 | Smith | G06F 30/20 |
| | | | | 703/1 |
| 2008/0007740 | A1 | 1/2008 | Vuong et al. | |
| 2008/0027691 | A1* | 1/2008 | Kobayashi | G05B 17/02 |
| | | | | 703/6 |
| 2008/0223716 | A1* | 9/2008 | Ockenfuss | C23C 14/52 |
| | | | | 204/298.03 |
| 2009/0307163 | A1* | 12/2009 | Jang | G01B 11/0683 |
| | | | | 702/170 |
| 2011/0027704 | A1 | 2/2011 | Cramer et al. | |
| 2011/0043791 | A1 | 2/2011 | Smilde et al. | |
| 2011/0224963 | A1* | 9/2011 | Isoyan | G03F 7/705 |
| | | | | 703/14 |
| 2012/0242970 | A1 | 9/2012 | Smilde et al. | |
| 2013/0055173 | A1* | 2/2013 | Wang | G03F 7/2059 |
| | | | | 716/53 |
| 2013/0080984 | A1* | 3/2013 | Liu | G06F 30/398 |
| | | | | 716/112 |
| 2016/0003609 | A1 | 1/2016 | Shchegrov et al. | |
| 2016/0140267 | A1 | 5/2016 | Chen et al. | |
| 2016/0291482 | A1* | 10/2016 | Shih | G03F 7/70641 |
| 2016/0335384 | A1* | 11/2016 | Song | G06F 30/39 |
| 2016/0378904 | A1* | 12/2016 | Greco | G03F 7/70633 |
| | | | | 716/51 |
| 2017/0039302 | A1* | 2/2017 | Nakamura | G06F 30/23 |
| 2017/0109646 | A1* | 4/2017 | David | G03F 7/70625 |
| 2018/0165388 | A1* | 6/2018 | Liu | G03F 7/705 |
| 2018/0218090 | A1* | 8/2018 | Liu | G06F 30/398 |
| 2018/0253017 | A1* | 9/2018 | Adel | G03F 7/7085 |
| 2018/0275523 | A1* | 9/2018 | Biafore | G01N 21/8851 |
| 2018/0314163 | A1 | 11/2018 | Liu | |
| 2020/0110852 | A1* | 4/2020 | Banna | G06F 30/39 |
| 2020/0201952 | A1* | 6/2020 | Kim | G06F 30/367 |
| 2021/0232748 | A1* | 7/2021 | Hsu | G03F 7/70433 |

FOREIGN PATENT DOCUMENTS

| | | | | |
|---|---|---|---|---|
| KR | 10-2016-0104066 | | 9/2016 | |
| TW | 201702753 A | * | 1/2017 | G03F 7/705 |
| TW | 201821899 | | 6/2018 | |
| WO | 2009078708 | | 6/2009 | |
| WO | 2009106279 | | 9/2009 | |
| WO | 2018/041513 | | 3/2018 | |
| WO | 2019/048214 | | 3/2019 | |

OTHER PUBLICATIONS

International Search Report and Written Opinion issued in corresponding PCT Patent Application No. PCT/EP2020/065400, dated Sep. 25, 2020.

Taiwanese Office Action issued in corresponding Taiwanese Patent Application No. 109120155, dated Jul. 21, 2021.

Anonymous, "Using metrology to calibrate a deposition model", Research Disclosure, Kenneth Mason Publications, vol. 661, No. 26 (May 1, 2019).

Adel, Michael E. et al.: "Stack and topography verification as an enabler for computational metrology target design", Proc. of SPIE, vol. 9424 (Mar. 19, 2015).

Office Action issued in corresponding Japanese Patent Application No. 2021-575253, dated Mar. 29, 2023.

Office Action issued in Japanese Patent Application No. 2021-575253, dated Jan. 10, 2024.

H. Yang et.al., "Imbalance Aware Lithography Hotspot Detection: a Deep Learning Approach", Proc. of SPIE, vol. 10148, pp. 1-16 (2017).

Office Action issued in corresponding Chinese Patent Application No. 202080047195.9, dated Jan. 9, 2024.

\* cited by examiner

METHOD FOR APPLYING A DEPOSITION MODEL IN A SEMICONDUCTOR MANUFACTURING PROCESS

CROSS-REFERENCE TO RELATED APPLICATIONS

This application is the U.S. national phase entry of PCT Patent Application No. PCT/EP2020/065400 which was filed on Jun. 4, 2020, which claims the benefit of priority of U.S. Provisional Application No. 62/870,432 which was filed on Jul. 3, 2019 and which is incorporated herein in its entirety by reference.

TECHNICAL FIELD

The description herein relates generally to mask manufacturing and patterning processes. More particularly, the description relates to applying a deposition model in a semiconductor manufacturing process.

BACKGROUND

A lithographic projection apparatus can be used, for example, in the manufacture of integrated circuits (ICs). A patterning device (e.g., a mask) may include or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate includes a plurality of adjacent target portions to which the pattern is transferred successively by the lithographic projection apparatus, one target portion at a time. In one type of lithographic projection apparatuses, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating, and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, deposition, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, deposition, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, deposition, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but are not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, a method for applying a deposition model in a semiconductor manufacturing process is provided. The method comprises predicting a deposition profile of a substrate using the deposition model; and using the predicted deposition profile to enhance a metrology target design.

In an embodiment, the method further comprises calibrating the deposition model using experimental cross-section profile information from a layer of a physical wafer.

In an embodiment, the deposition model is a machine-learning model, and calibrating the deposition model comprises training the machine-learning model.

In an embodiment, the experimental cross-section profile information comprises visual or dimensional comparisons between an electronic image of the substrate and a corresponding electronic depiction of the substrate generated using the model.

In an embodiment, the metrology target design comprises an alignment metrology target design or an overlay metrology target design.

In an embodiment, using the predicted deposition profile to enhance a metrology target design comprises predicting a signal strength of an alignment metrology target design and enhancing the alignment metrology target design based on the predicted signal strength.

In an embodiment, enhancing the alignment metrology target design comprises adjusting one or more dimensions and/or a pattern of the alignment metrology target design and/or adjusting a deposition material to maximize the predicted signal strength.

In an embodiment, using the predicted deposition profile to enhance a metrology target design comprises predicting a signal strength of an overlay metrology target design and enhancing the overlay metrology target design based on the predicted signal strength.

In an embodiment, enhancing the overlay metrology target design comprises adjusting one or more dimensions and/or a pattern of the overlay metrology target design and/or adjusting a deposition material to maximize the predicted signal strength.

In an embodiment, the method further comprises using the predicted deposition profile to determine the deviation of the predicted deposition profile from a target profile caused by asymmetry, and using the deviation to predict an asymmetry component of a measured metrology target signal.

In an embodiment, the method further comprises using the deviation to correct for asymmetry induced scanner offset. In an embodiment, the correcting comprises removing the asymmetry component of the measured metrology target signal. In an embodiment, removing the asymmetry component of the measured metrology target signal comprises subtracting the asymmetry component from the measured metrology target signal.

In an embodiment, the asymmetry component of the metrology target signal is predicted based on the deviation of the predicted deposition profile from the target profile.

In an embodiment, the method comprises predicting overlay and/or alignment based on the enhanced metrology target design.

According to another embodiment, a semiconductor manufacturing process modeling method is provided. The method comprises predicting a deposition profile of a substrate based on a deposition model; using the predicted deposition profile to enhance a metrology target design; determining one or more photolithography process parameters based on the enhanced metrology target design; and determining an adjustment for a photolithography apparatus based on the one or more determined photolithography process parameters.

In an embodiment, the one or more determined photolithography process parameters comprise one or more of overlay or alignment.

In an embodiment, the method further comprises adjusting a metrology target design from a first metrology target design to a second metrology target design based on the overlay or the alignment.

In an embodiment, the metrology target design comprises an alignment metrology target design or an overlay metrology target design.

In an embodiment, the method further comprises using the predicted deposition profile to determine the deviation of the predicted deposition profile from a target profile caused by asymmetry, and using the deviation to correct for an asymmetry induced scanner offset.

In an embodiment, the method further comprises adjusting the photolithography apparatus based on the determined adjustment.

In an embodiment, the method further comprises calibrating the deposition model using experimental cross-section profile information from a layer of a physical wafer.

According to another embodiment, a computer program product is provided. The computer program product comprises a non-transitory computer readable medium having instructions recorded thereon, the instructions when executed by a computer implementing the method(s) described above.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
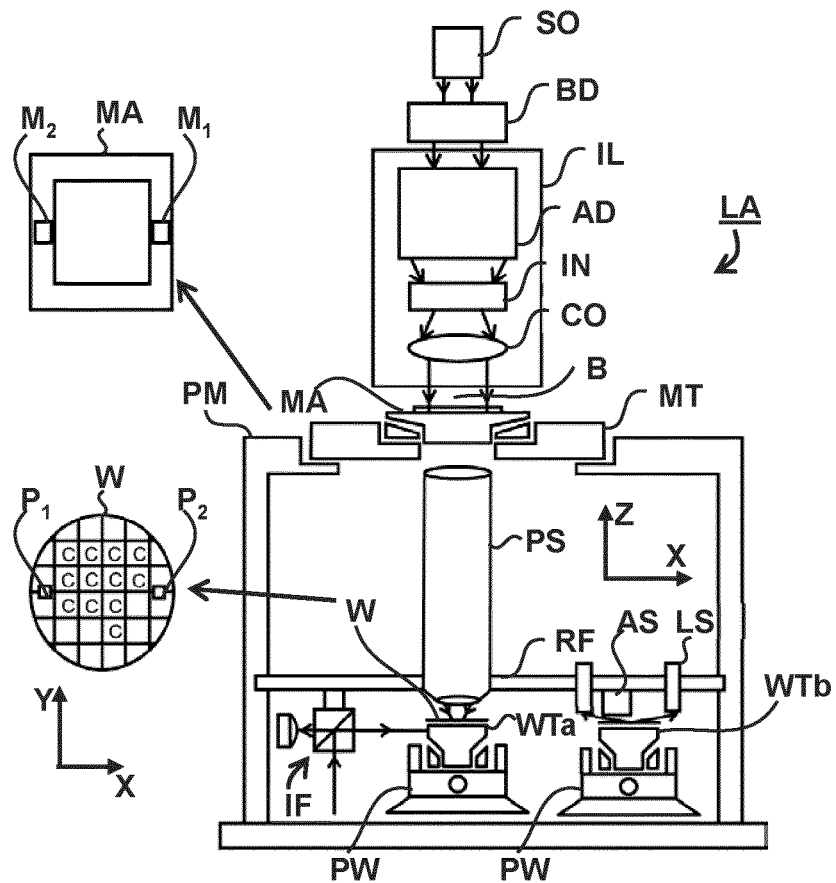
FIG. 1 schematically depicts a lithography apparatus, according to an embodiment.

The description herein relates generally to mask manufacturing and patterning processes. More particularly, the description relates to apparatuses or methods for applying a deposition model in a semiconductor manufacturing process. The apparatuses or methods may include, or be associated with, simulation systems configured to predict or otherwise determine a deposition profile based on a deposition model for alignment and/or overlay metrology target design, as just one example, or in other operations. As described in more detail below, overlay and/or alignment is an indication of a relative shift between a current layer of a substrate (e.g., wafer) and the previous layer and/or a relative position of two or more design features relative to each other. Overlay and/or alignment is often determined based on the optical response of metrology marks included in scribe lines and/or in other locations. Overlay and/or alignment can be measured by any suitable metrology system, e.g., a scatterometry system, a diffraction-based overlay system, a dark field or bright field microscope, an image-based overlay metrology system, an optical metrology system and/or electron beam metrology system (e.g. a CD-SEM). The metrology marks and the optical response are typically modeled using software tools such as a design for control program and a metrology system to facilitate optimization of the substrate (e.g., wafer) manufacturing recipe and metrology mark design (e.g., to reduce overlay, enhance alignment, and/or for other purposes) before a semiconductor device is physically manufactured.

A geometric model is used in current overlay, alignment, and/or other metrology mark design for semiconductor manufacturing process definition (e.g., to model or otherwise determine etch, deposition, and/or other profiles). For example, a metrology target design program or a design for control program or other similar tools need a deposition profile, an etch profile, and/or other profiles (among many other process related inputs) to construct a "stack" that models an actual substrate (e.g., wafer) to feed back into rigorous coupled-wave analysis (RCWA) for accurate simulation. However, the geometric model is overly simplistic (e.g., the model does not simulate deposition, the model uses a constant etch depth, sidewall angle, a binary either etchable or non-etchable description of materials in the stack, etc.). Deposition (and/or etch) effects on a substrate (e.g., the wafer) are not well described by the geometric model, which decreases simulation accuracy, and often results in poor correlation between simulated alignment and/or overlay measurements and actual alignment and/or overlay measurements. Scatterometer or other metrology mark measurement signals can be sensitive to modeled post-deposition profiles. Post deposition profile differences between modeled and actual profiles are often caused by the geometric model's inability to accurately account for local pattern features such as density and resist profile, and global effects such as chemical and physical non-uniformity.

With the system(s) and method(s) described below, deposition is modeled. Thus, more accurate simulated profiles may be fed into a metrology target design program or a design for control program (or other similar tools), which may help more accurately simulate the response of the overlay or alignment measurement signal or other scanner metrology mark signals, to achieve more accurate predictions of alignment, overlay, or other parameters.

The deposition model (in contrast to prior geometric models) of the present system(s) and method(s) uses multiple parameters to represent the physics and material behavior during deposition, and reconstructs the post deposition profile by capturing various deposition effects. In addition, the model of the present system(s) and method(s) may be calibrated based on cross sectional scanning electron microscope (SEM) images and/or other measurements to ensure modeled process steps described herein accurately reflect specific deposition processes.

The following paragraphs describe several components of a system and/or related systems, as well as methods for determining a deposition profile of a substrate for simulation systems. As described above these simulation systems may use the determined deposition profile during alignment and/or overlay metrology target design, for example, or during other operations.

Although specific reference may be made in this text to the manufacture of integrated circuits (ICs), it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

FIG. 1 schematically depicts an embodiment of a lithographic apparatus LA. The apparatus comprises:
an illumination system (illuminator) IL configured to condition a radiation beam B (e.g. UV radiation, DUV radiation, or EUV radiation);
a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame (RF).

As depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode, the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes:

1. In step mode, the support structure MT and the substrate table WT are kept essentially stationary, while a pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes multiple processed layers.

The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that other patterns are not defective.

Figure 2:
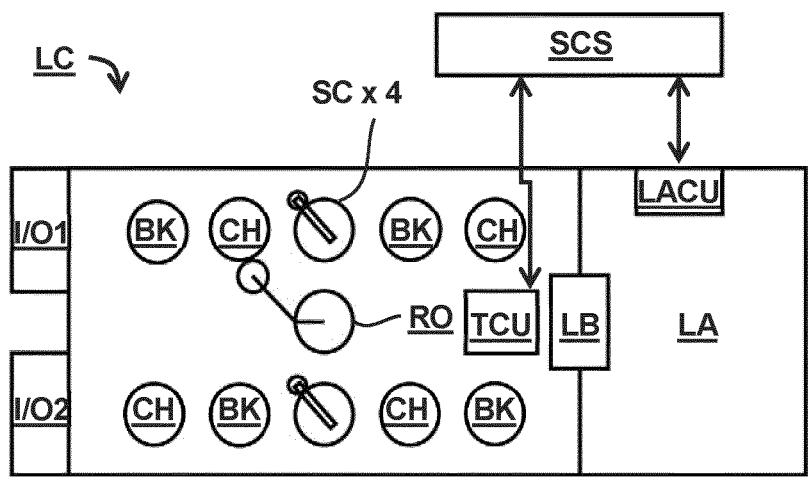
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system that measures some or all of the substrates W (FIG. 1) that have been processed in the lithocell or other objects in the lithocell. The metrology system may be part of the lithocell LC, for example it may be part of the lithographic apparatus LA (such as alignment sensor AS (FIG. 1)).

The one or more measured parameters may include, for example, alignment, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching, after-etching, after deposition, and/or at other times.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as a scatterometer metrology tool, an on-photolithography apparatus metrology system), mechanical measurement (e.g., profiling using a stylus, atomic force microscopy (AFM)), and/or non-optical imaging (e.g., scanning electron microscopy (SEM)). A substrate alignment system, such as one used in a lithography apparatus to read alignment mark locations on a substrate to determine the substrate location, thus enabling better overlay, as described in U.S. Pat. No. 6,961,116, which is incorporated by reference herein in its entirety, can employ a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which meet specifications.

Within a metrology system MET, a metrology apparatus is used to determine one or more properties of the substrate, and in particular, how one or more properties of different substrates vary, or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
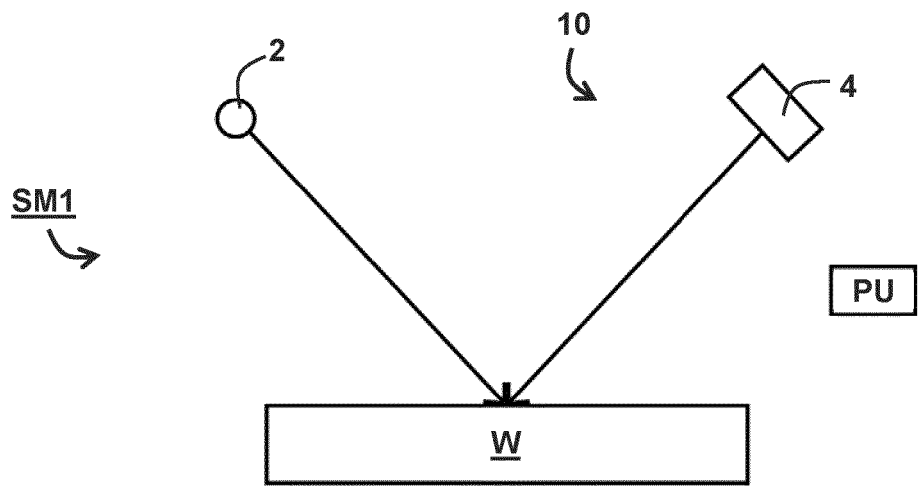
FIG. 3 schematically depicts an example inspection apparatus and metrology technique, according to an embodiment.
Figure 3:
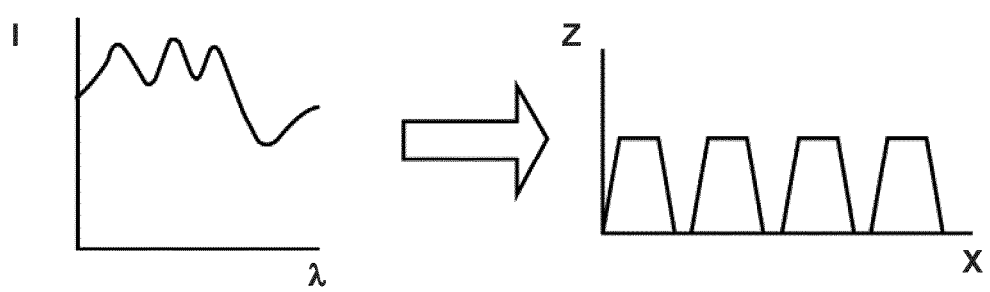

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum (intensity as a function of wavelength) of the specular reflected radiation, as shown, e.g., in the graph in the lower left of FIG. 3. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known, and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
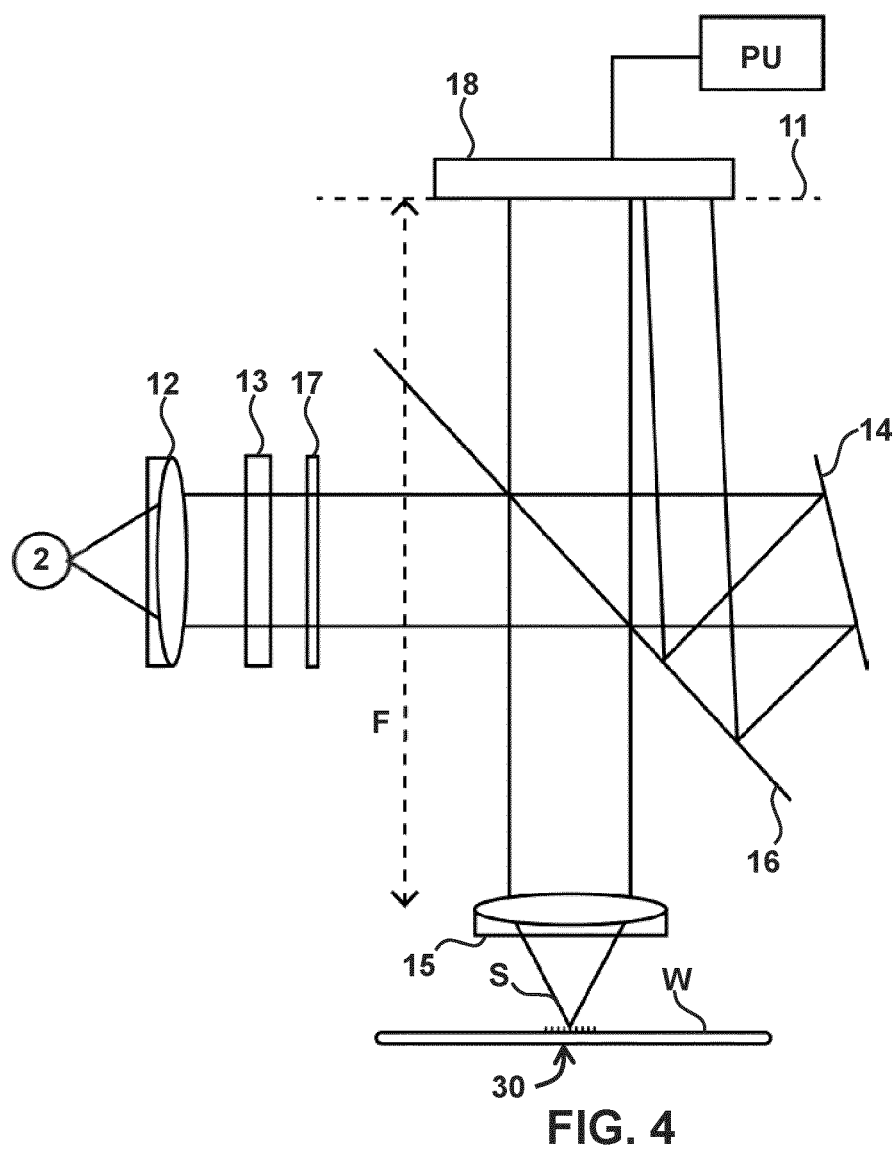
FIG. 4 schematically depicts an example inspection apparatus, according to an embodiment.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically, many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, for example, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines (e.g., which may be covered by a deposition layer). The target 30 may be a 2-D grating, which is printed such that after development, the grating is formed of solid resist pillars or vias in the resist. The bars, pillars or vias may be etched into or on the substrate (e.g., into one or more layers on the substrate), covered by a deposition layer, and/or have other properties. The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
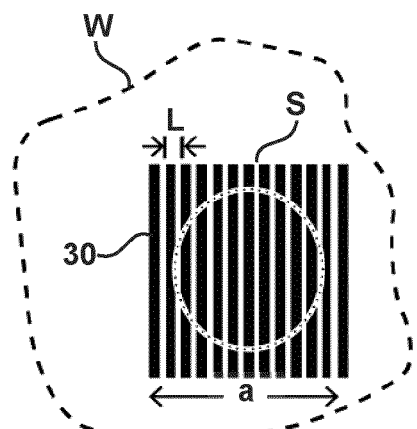
FIG. 5 illustrates the relationship between an illumination spot of an inspection apparatus and a metrology target, according to an embodiment.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 (FIG. 4) may be configured to provide illumination of a uniform intensity across a back focal plane of objective 15. Alternatively, by, e.g., including an aperture in the illumination path, illumination may be restricted to on axis or off axis directions.

Figure 6:
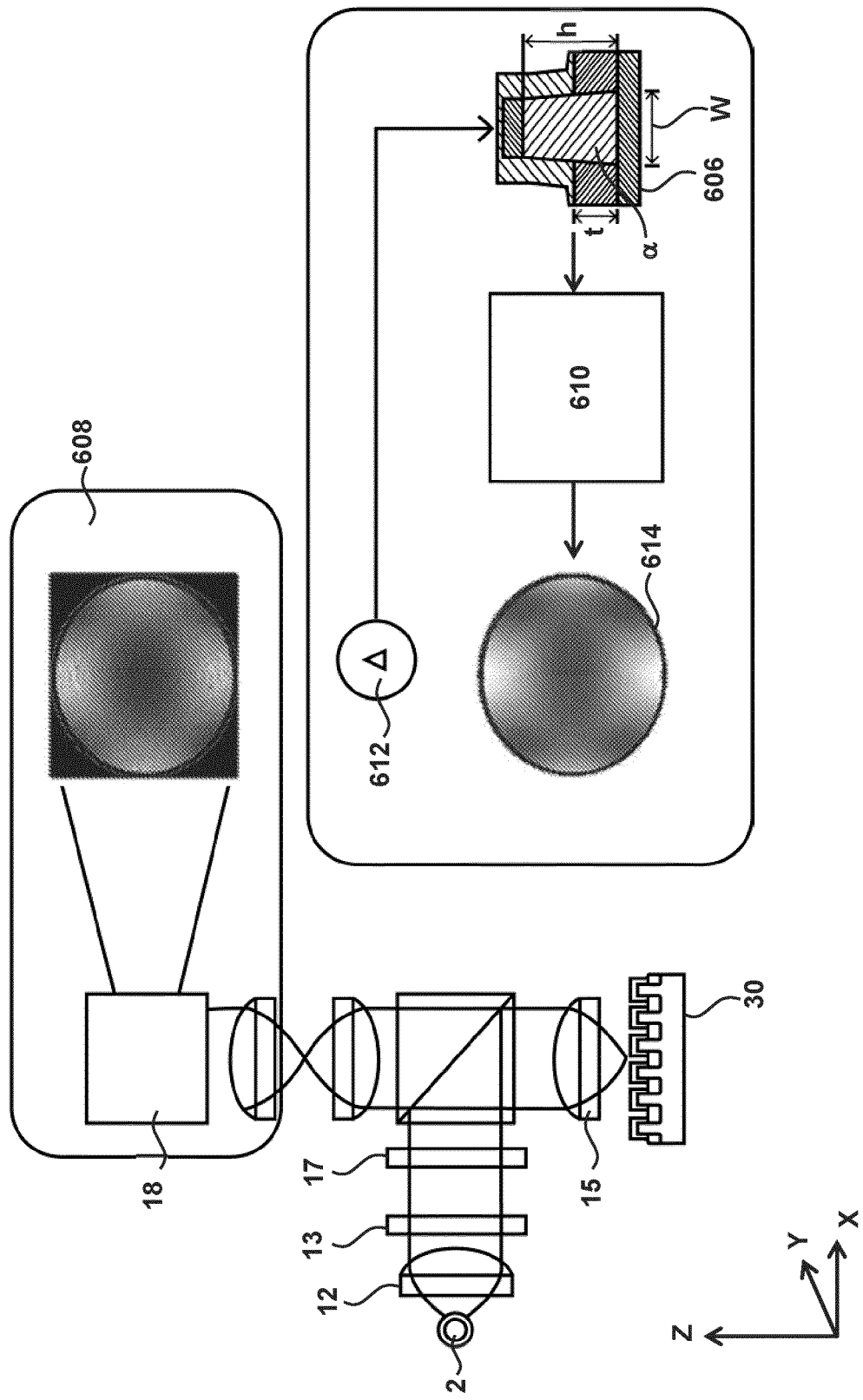
FIG. 6 schematically depicts a process of deriving a plurality of variables of interest based on measurement data, according to an embodiment.

FIG. 6 schematically depicts an example process of the determination of the value of one or more variables of interest of a target pattern 30 based on measurement data obtained using metrology. Radiation detected by the detector 18 provides a measured radiation distribution 608 for target 30. For a given target 30, a radiation distribution 612 can be computed/simulated from a parameterized model 606 using, for example, a numerical Maxwell solver 610. The parameterized model 606 shows example layers of various materials making up, and associated with, the target. The parameterized model 606 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 608 is then compared at 612 to the computed radiation distribution 612 to determine the difference between the two. If there is a difference, the values of one or more of the variables of the parameterized model 606 may be varied, a new computed radiation distribution 612 calculated and compared against the measured radiation distribution 608 until there is sufficient match between the measured radiation distribution 608 and the computed radiation distribution 612. At that point, the values of the variables of the parameterized model 606 provide a good or best match of the geometry of the actual target 30. In an embodiment, there is sufficient match when a difference between the measured radiation distribution 608 and the computed radiation distribution 612 is within a tolerance threshold.

Figure 7A:
FIG. 7A is a flow chart showing various stages of a 'design for control' process flow, according to an embodiment.

FIG. 7A shows a flowchart that lists the main stages of a "design for control" method, which may be implemented as a metrology target design software program. In stage 710, the materials to be used in the lithography process are selected. The materials may be selected from a materials library interfaced with the program through an appropriate GUI. In stage 720, a lithography process is defined by entering each of the process steps, and building a computer simulation model for the entire process sequence. In stage 730, a metrology target is defined, i.e. dimensions and other characteristics of various features included in the target are entered into the a metrology target design program or a design for control program. For example, if a grating is included in a structure, then number of grating elements, width of individual grating elements, spacing between two grating elements etc. have to be defined. In stage 740, the 3D geometry is created. This step also considers whether there is any information relevant to a multi-layer target design, for example, the relative shifts between different layers. This feature enables multi-layer target design. In stage 750, the final geometry of the designed target is visualized. As will be explained in greater detail below, not only the final design is visualized, but as the designer applies various steps of the lithography process, he/she can visualize how the 3D geometry is being formed and changed because of process-induced effects. For example, the 3D geometry after resist patterning is different from the 3D geometry after resist removal and etching.

Figure 7B:
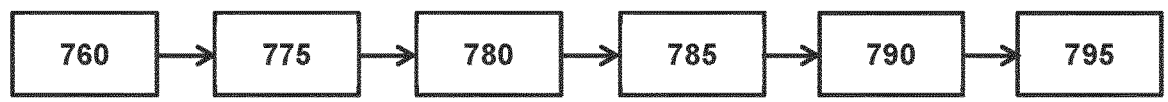
FIG. 7B is a block diagram showing various stages for visualization, according to an embodiment.

An important aspect of the present disclosure is that the target designer is enabled to visualize the stages of the method to facilitate their perception and control during modeling and simulation. Different visualization tools, referred to as "viewers," are built into the metrology target design software program. For example, as shown in FIG. 7B, a designer can view material plots 760 (and may also get a run time estimation plot) depending on the defined lithography process and target. Once the lithography model is created, the designer can view the model parameters through model viewer tool 775. Design layout viewer tool 780 may be used to view the design layout (e.g., visual rendering of the GDS file). Resist profile viewer tool 785 may be used to view pattern profiles in a resist. Geometry viewer tool 790 may be used to view 3D structures on a substrate. A pupil viewer tool 795 may be used to view simulated response on a metrology tool. Persons skilled in the art would understand that these viewing tools are available to enhance the understanding of the designer during design and simulation. One or more of these tools may not be present in some embodiments of metrology target design software, and additional viewing tools may be there in some other embodiments.

Figure 7C:
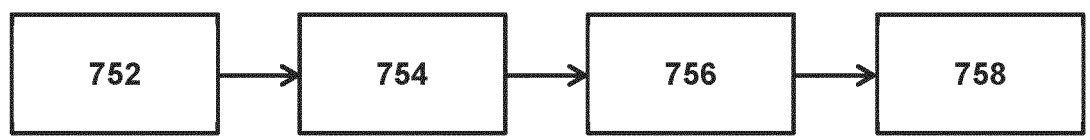
FIG. 7C is a flow chart showing how the 'design for control' process determines metrology target designs robust against process perturbations, according to an embodiment.

FIG. 7C shows a flow chart that illustrates how the metrology target design process increases efficiency in the overall simulation process by reducing the number of metrology targets selected for the actual simulation of the lithography process. As mentioned before, metrology target design enables designers to design thousands or even millions of designs. Not all of these designs may be robust against variations in the process steps. To select a subset of target designs that can withstand process variation, a lithographer may intentionally perturb one or more steps of the defined lithography process, as shown in block 752. The introduction of the perturbation alters the entire process sequence with respect to how it was originally defined. Therefore, applying the perturbed process sequence (block 754) alters the 3D geometry of the designed target too. A lithographer only selects the perturbations that show non-zero alternations in the original design targets and creates a subset of selected process perturbations (block 756). The lithography process is then simulated with this subset of process perturbations (block 758).

The manufacturing or fabrication of a substrate using the lithographic process (or patterning process in general) typically involves process variations. The process variations are not uniform across the substrate. For example, in deposition processes, films tend to be thicker at the center of the substrate and be thinner when close to an edge. These systematic variations are usually reflected in measurement data as 'fingerprints', which are characteristics of a substrate based on known process conditions. In other words, there exists a stack on a substrate that has a spatial variation as a function of substrate coordinate. A stack comprises multiple layers formed on a substrate during the patterning process to form a selected pattern (e.g., a design pattern) on the substrate. Each layer of the stack can be associated with a thickness, material properties, and features and related parameters of the patterning process (e.g. CD, pitch, overlay, etc.).

Figure 8:
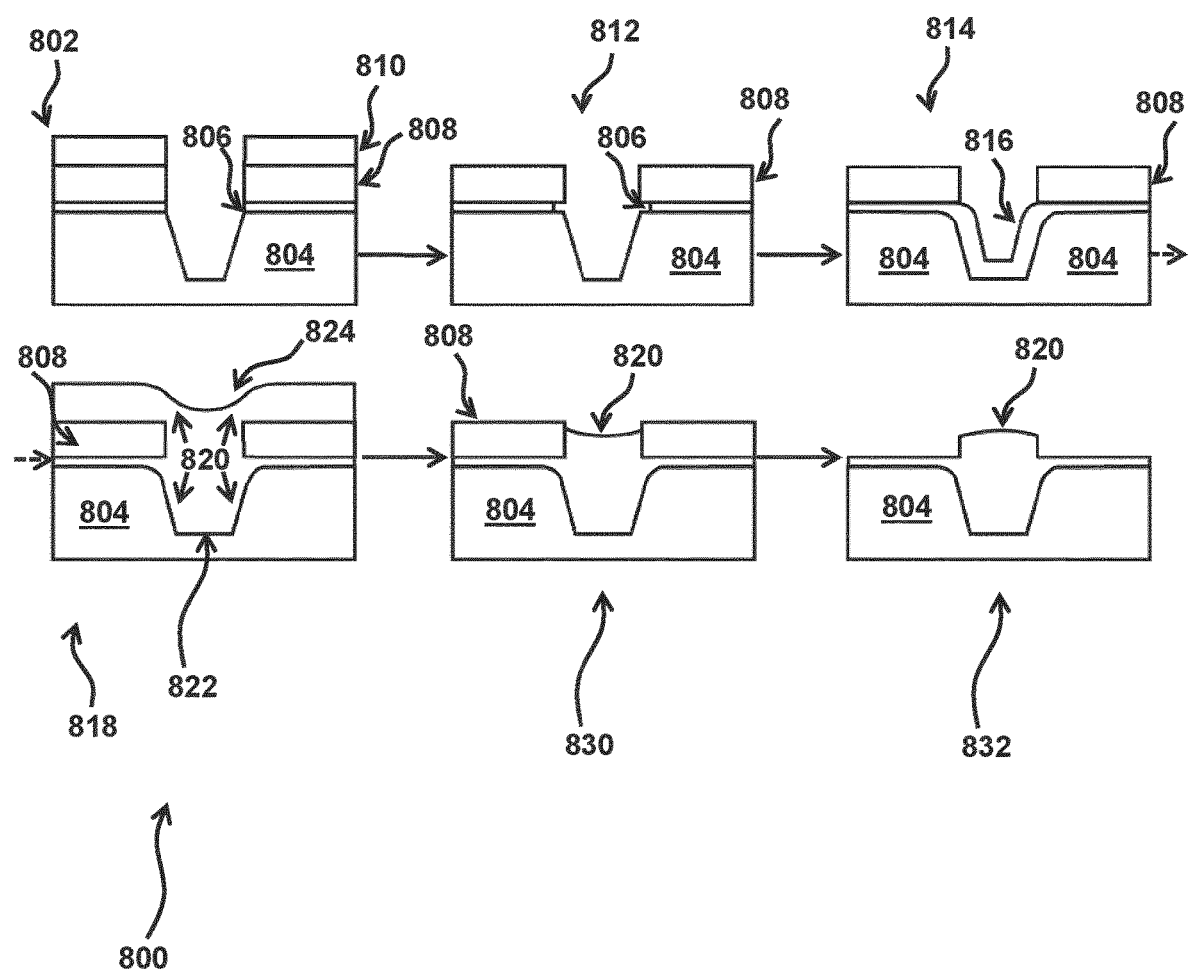
FIG. 8 illustrates deposition as part of a typical shallow trench isolation (STI) process flow, according to an embodiment.

As described herein, deposition is an important process step in modern semiconductor manufacturing. Deposition is used to deposit a layer of material on top of a patterned or unpatterned surface. Deposition usually takes place after etching and before chemical mechanical polishing (CMP). Deposition is illustrated as part of a typical shallow trench isolation (STI) process flow 800 in FIG. 8. View 802 illustrates stack and trench etching with a silicon wafer 804, a pad oxide 806, a nitride layer 808 and resist 810. View 812 illustrates pad oxide 806 underetching. View 814 illustrates a liner oxide 816. A deposition step is demonstrated in view 818, where chemical vapor deposition is employed for filling the gap with oxide 820. When a new material is deposited, the topography of a bottom surface 822 is partially transferred to a top surface 824. The new topography will impact the geometry of the in-die pattern as well as the metrology targets relevant for overlay and/or alignment measurements, for example. A reliable deposition model (as is described herein) is important for the prediction and correction of these and other topography variations. View 830 illustrates chemical mechanical polishing, and view 832 illustrates a nitride stripping step.

Figure 9:
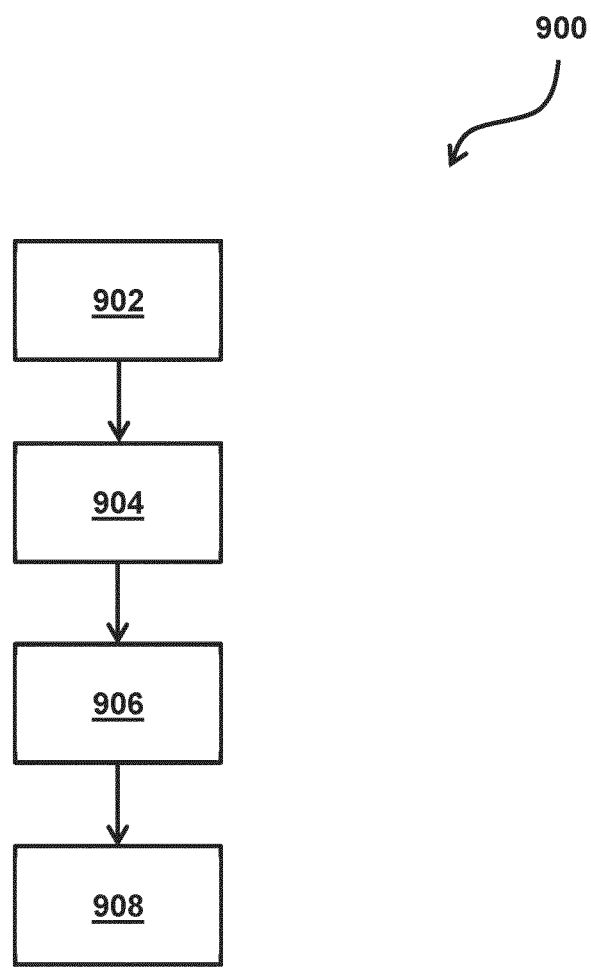
FIG. 9 illustrates a method for applying a deposition model in a semiconductor manufacturing process, according to an embodiment.

FIG. 9 illustrates an exemplary method 900 for applying a deposition model in a semiconductor manufacturing process according to an embodiment of the present disclosure. In some embodiments, method 900 comprises generating and/or calibrating a deposition model 902, inputting process information into the deposition model 904, predicting a deposition profile 906, using 908 the predicted deposition profile to (1) enhance a metrology target design, and/or (2) determine a deviation of a predicted deposition profile from a target profile caused by asymmetry, and/or other operations. Prior systems do not utilize a method similar to and/or the same as method 900 to take advantage of the predictive power of a calibrated deposition model for a scanner and/or other metrology tools. Traditional design of metrology targets, for example, does not consider the effects of deposition. Method 900 is described below in the context of metrology marks, but this is not intended to be limiting. Method 900 may be generally applied to a number of different processes where deposition profile determination is useful. A simulation system for which a deposition profile is determined may include a simulation system that simulates a response of metrology or inspection systems to the deposition profile, or other simulation systems. For example, a determined deposition profile/simulation system can be used for calibrating an OPC model measured with optical systems or SEM, it can be used to simulate cross wafer fingerprints from metrology systems, or for other purposes.

Method 900 is an enhanced (relative to prior art systems) method that facilitates more accurate modeling and/or determination of parameters based on a deposition profile. This more accurate modeling and/or determination based on a deposition profile may enhance determination of the relative shift between a current layer of a wafer and the previous layer—overlay, for example, though other purposes are contemplated (e.g., alignment, etc.). As described above, overlay and/or alignment is often determined based on the optical response of metrology marks included in scribe lines and/or in other locations. In some embodiments, method 900 generates a more accurate (relative to prior art systems) metrology target model, which in turn, facilitates more accurate (relative to prior art systems) determination of alignment, overlay, or other parameters.

Operation 902 comprises generating and/or calibrating the deposition model. In some embodiments, generating the deposition model may be based on starting profiles of substrates (e.g., layers and/or portions of layers of wafers, and/or other substrates) similar to a present substrate (e.g., previously modeled, manufactured, and/or measured profiles of prior substrates). This information may be stored in a database, for example, and/or in other locations. The starting profiles may be and/or include profiles such as lithography photo resist profiles, generic masking layers for things such as a hardmask, or other masking layer profiles, etch profiles, and/or other profiles. In general, the starting profiles may be any pattern designs used as input for building the deposition model. The pattern designs may indicate which parts of a substrate (e.g., wafer) on which material will be deposited and which parts of a substrate (e.g., wafer) will not have material deposited. The pattern designs may indicate dimensions, material properties, and other characteristics of these areas. In an embodiment, the starting profiles for the substrates comprise after patterning profiles. In an embodiment, the starting profiles for the substrates comprise after develop inspection (ADI) dimensions, after etch inspection (AEI) dimensions, and/or other dimensions. ADI, for example, is often performed after photoresist exposure and development. In an embodiment, determining the starting profiles for substrates comprise one or more of obtaining, designing, or measuring dimensions or other features of the starting profile.

For example, obtaining dimensions or other features of starting profiles may include electronically accessing this information via databases of one or more external computing systems, accessing this information in local electronic storage, receiving or accessing this information via network communications, receiving this information via upload, download, or other electronic file transfer from non-transitory storage media and/or other electronic storage sources, or obtaining this information by other methods. As another example, designed dimensions and/or other features of starting profiles may be entered or selected by, or otherwise communicated from, a user via a user interface associated with a metrology target design program or design for control program. As a third example, dimensions or other features of starting profiles may be measured. Such measurements may be taken, for example, on immediately previous (e.g., before deposition) layers of a physical or modeled wafer going through a fabrication process. In some embodiments, the starting profiles may also be built based on assumptions made by a designer, the system, or other sources.

In some embodiments, generating the deposition model may be based on deposition recipes (e.g., that describe process parameters for chemical vapor deposition), and/or other information. In some embodiments, the deposition model may be generated for one or more regions of interest of a substrate (e.g., a layer of a wafer, a full layer of the wafer, a stack, and/or other regions).

In some embodiments, generating the deposition model may comprise generating an empirical model that performs the operations of the method described herein. The empirical model may predict outputs based on correlations between various inputs (e.g., one or more characteristics of a mask or wafer image, one or more characteristics of a design layout, one or more characteristics of the patterning device, one or more characteristics of the deposition process).

As an example, the empirical model may be a machine learning model and/or any other parameterized model. In some embodiments, the machine learning model (for example) may be and/or include mathematical equations, algorithms, plots, charts, networks (e.g., neural networks), and/or other tools and machine learning model components. For example, the machine learning model may be and/or include one or more neural networks having an input layer, an output layer, and one or more intermediate or hidden layers. In some embodiments, the one or more neural networks may be and/or include deep neural networks (e.g., neural networks that have one or more intermediate or hidden layers between the input and output layers).

As an example, the one or more neural networks may be based on a large collection of neural units (or artificial neurons). The one or more neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In some embodiments, each individual neural unit may have a summation function that combines the values of all its inputs together. In some embodiments, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the one or more neural networks may include multiple layers (e.g., where a signal path traverses from front layers to back layers). In some embodiments, back propagation techniques may be utilized by the neural networks, where forward stimulation is used to reset weights on the "front" neural units. In some embodiments, stimulation and inhibition for the one or more neural networks may be freer flowing, with connections interacting in a more chaotic and complex fashion. In some embodiments, the intermediate layers of the one or more neural networks include one or more convolutional layers, one or more recurrent layers, and/or other layers.

In some embodiments, the deposition model may be calibrated using experimental cross-section profile information from a substrate (e.g., a layer of a physical wafer). The experimental cross-section profile information comprises visual or dimensional comparisons between an electronic image of the layer of the physical wafer and a corresponding electronic depiction of the layer generated using the deposition model, and/or other information. For example, the model may be calibrated by cross section scanning electron microscope (SEM) images to accurately describe specific deposition processes.

In an embodiment, one or more (parameters of) the deposition model may be calibrated by fitting a simulated deposition profile to a corresponding cross section of a substrate (e.g., a physical wafer) using the SEM or other tools. In an SEM, a primary electron beam is emitted from an electron source and converged by a condenser lens, and then passes through a beam deflector, an E×B deflector, and an objective lens to irradiate a substrate on a substrate table at a focus. When the substrate is irradiated with the electron beam, secondary electrons are generated from the substrate. The secondary electrons are deflected by the E×B deflector and detected by a secondary electron detector. A two-dimensional electron beam image can be obtained by detecting the electrons generated from the sample in synchronization with, e.g., two dimensional scanning of the electron beam by the beam deflector or with repetitive scanning of the electron beam by the beam deflector in an X or Y direction, together with continuous movement of the substrate by the substrate table in the other of the X or Y direction. A signal detected by the secondary electron detector is converted to a digital signal by an analog/digital (A/D) converter, and the digital signal is sent to an image processing system. In an embodiment, the image processing system may have memory to store all or part of digital images for processing by a processing unit. The processing unit (e.g., specially designed hardware or a combination of hardware and software or a computer readable medium comprising software) is configured to convert or process the digital images into datasets representative of the digital images. In an embodiment, the processing unit is configured or programmed to cause execution of a method described herein. Further, the image processing system may have a storage medium configured to store the digital images and corresponding datasets in a reference database. A display device may be connected with the image processing system, so that an operator can conduct necessary operation of the equipment with the help of a graphical user interface.

In some embodiments, operation 902 may comprise generating an electronic depiction (e.g., a model, an electronic image, etc.) of a substrate (e.g., a layer of a wafer) to facilitate a visual comparison between the electronic depiction and the image of the corresponding substrate (e.g., layer of the physical wafer). The electronic depiction may be an image, a model, and/or other electronic depictions. The electronic depiction may be a cross-sectional image, a non-cross-sectional image, numbers or code representative of a layer (e.g., not an image at all), or other information that forms an electronic depiction. In an embodiment, operation 902 may include generating an electronic depiction of the substrate (e.g., layer of the wafer) to facilitate dimensional measurement of the electronic depiction for comparison to dimensions obtained from the SEM image of the corresponding substrate (e.g., layer of the physical wafer).

In an embodiment, one or more parameters of the deposition model may be calibrated based on information from any metrology system (e.g., a scatterometer, etc.). Calibration may include calibration of parameters in a mask layer model (e.g., parameters that influence the deposition profile of the model). For example, calibration may include adjusting one or more parameters such as the mask critical dimension offset, deposition rate, deposition material, or other parameters) based on similarities or differences between the simulated profile and the corresponding cross section of the physical wafer. The calibrated method (e.g., model) may be used to predict a deposition profile (of a metrology target design as just one example), which may be fed to a simulation system such as a design-for-control program (or other similar design software) to predict (or simulate) overlay and/or alignment measurement signal performance, e.g., on an overlay and alignment measurement system. In an embodiment, calibration operations are performed iteratively until the modeled deposition profile corresponds to a deposition profile in an image and/or other electronic depictions (e.g., a model) of a corresponding layer of a physical wafer.

In some embodiments, as described above, the deposition model is a machine-learning model (e.g., comprising one or more neural networks), and calibrating the deposition model comprises training the machine-learning model. The one or more neural networks may be trained (i.e., whose parameters are determined) using a set of training data. The training data may include a set of training samples. Each sample may be a pair comprising an input object (typically a vector, which may be called a feature vector) and a desired output value (also called the supervisory signal). A training algorithm analyzes the training data and adjusts the behavior of the neural network by adjusting the parameters (e.g., weights of one or more layers) of the neural network based on the training data. For example, given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network $g: X \rightarrow Y$, where X is the input space and Y is the output space. A feature vector is an n-dimensional vector of numerical features that represent some object (e.g., a wafer design as in the example above, a clip, etc.). The vector space associated with these vectors is often called the feature space. After training, the neural network may be used for making predictions using new samples.

Operation 904 comprises inputting process information into the deposition model. Operation 904 may include, for example, providing the process information to a trained machine learning model that includes a neural network as input. For example, the process information may include the starting profile of a substrate (e.g., layer of a wafer). The starting profile may be any pattern design used as input for the deposition model. The pattern design may indicate which parts of a substrate on which material will be deposited and which parts of a substrate will not have material deposited. The pattern design may indicate dimensions, material properties, and other characteristics of these areas. In some embodiments, the process information may include a specific deposition recipe (e.g., that describe process parameters for a chemical vapor deposition process), and/or other information.

Operation 906 comprises predicting a deposition profile 906. The predicted deposition profile may be a predicted deposition profile of a substrate using the deposition model. Predicting a deposition profile may comprise simulating a deposition operation on a given starting profile according to the deposition process recipe. In an embodiment, simulating the deposition operation on the starting profile may include determining one or more deposition rates for individual locations across the surface of a substrate. The one or more deposition rates may depend on a quantity and pattern of material being deposited, which parts of the pattern are covered or uncovered, the surrounding environment, or other factors, for example. In an embodiment, simulating the deposition operation on the starting profile comprises modifying dimensions or other characteristics of the starting profile based on the deposition process parameters, deposition model parameters and/or weights, the one or more deposition rates, and/or other information. This process of predicting a deposition profile may be repeated iteratively for example, until one or more deposition profile criteria (e.g., dimensions, surface characteristics, etc.) are satisfied.

Operation 908 comprises using the predicted deposition profile to (1) enhance a metrology target design, and/or (2) determine a deviation of the predicted deposition profile from a target profile caused by asymmetry, and/or other operations. For example, operation 908 may comprise predicting signal sensitivities of a metrology (e.g., alignment, overlay, etc.) target design, thus facilitating optimal design of (alignment, overlay, etc.) metrology targets. Predicted deviations in the geometry of the metrology targets from the original design (mark asymmetry) may be used to correct for asymmetry-induced scanner and metrology tool offsets (e.g., an overlay or alignment metrology tool), for example, and/or used for other purposes.

In some embodiments, operation 908 may include determining one or more photolithography process parameters based on the enhanced metrology target design and/or the deviation of the predicted deposition profile from the target profile, determining an adjustment for a photolithography apparatus based on the one or more determined photolithography process parameters, and/or other operations. The one or more determined photolithography process parameters may comprise one or more of overlay or alignment, for example. Adjusting the photolithography apparatus may be based on the determined adjustment and/or other information. In some embodiments, operation 908 may include adjusting a metrology target design from a first metrology target design to a second metrology target design based on the overlay or the alignment. The metrology target design may comprise an alignment metrology target design, an overlay metrology target design, and/or other designs.

In some embodiments, the metrology target design comprises an alignment metrology target design, an overlay metrology target design, and/or other metrology target designs. In some embodiments, using the predicted deposition profile to enhance a metrology target design comprises predicting a signal strength of an alignment metrology target design and enhancing the alignment metrology target design based on the predicted signal strength. Enhancing the alignment metrology target design may comprise adjusting one or more dimensions and/or a pattern of the alignment metrology target design, adjusting a deposition material, and/or adjusting other parameters to maximize the predicted signal strength.

In some embodiments, using the predicted deposition profile to enhance a metrology target design comprises predicting a signal strength of an overlay metrology target design and enhancing the overlay metrology target design based on the predicted signal strength. Enhancing the overlay metrology target design may comprise adjusting one or more dimensions and/or a pattern of the overlay metrology target design, adjusting a deposition material, and/or adjusting other parameters to maximize the predicted signal strength.

By way of a non-limiting example, and as described above, once the deposition model has been calibrated, it can be used to produce reliable predictions. In this example, the calibrated deposition model may be described by:

$$y = D(x, p_0)$$

where D represents the deposition model, $p_o$ represents the calibrated model (e.g., deposition) parameters, x is the geometry (e.g., of a layer of a wafer) before deposition, and y is the predicted geometry (e.g., the wafer layer profile after deposition). In one embodiment, the predictive power of the calibrated model can be used to design (the geometry of) metrology targets (described by x) that maximize the signal strength of a metrology target measured by sensors after deposition.

Figure 10:
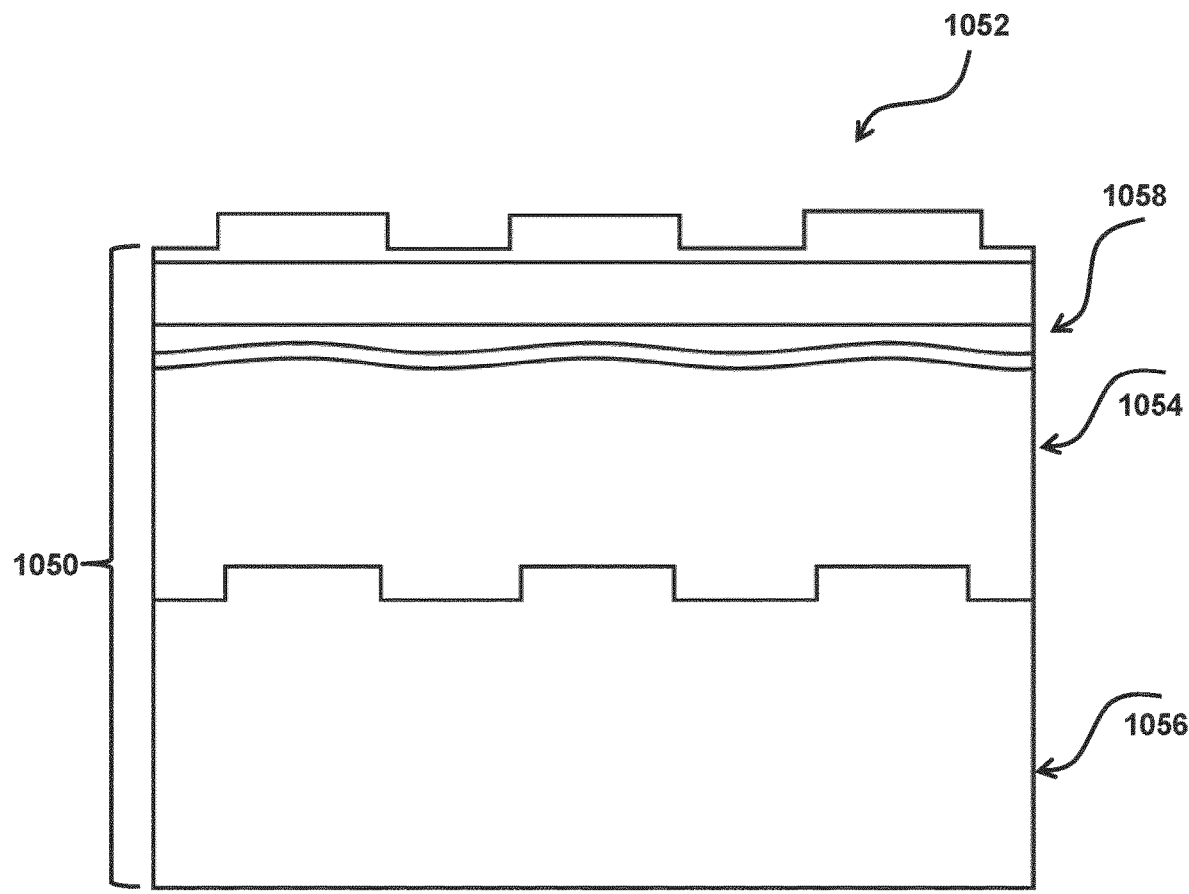
FIG. 10 illustrates a stack of an overlay target with an optically opaque material deposited on top of a bottom grating, according to an embodiment.

Using overlay as an example, FIG. 10 illustrates a stack 1050 of an overlay target 1052 with an optically opaque material 1054 deposited on (top of) a bottom grating 1056. In order to measure overlay, the topography of bottom grating 1056 needs to be transferred to the (top) surface 1058 of opaque material 1054. For a stronger overlay metrology mark signal, the amplitude of the topography of bottom grating 1056 may be maximized (e.g., so that top surface 1058 has substantially the same features after deposition). The present method and/or deposition model may be used to design bottom grating 1056 to maximize the amplitude of the topography of bottom grating 1056. For example, coupling the deposition model to a sensor model, the grating/target optimization problem may be formulated as:

$$x_0 = \mathrm{argmax}_x \left\| \frac{dS(D(x, p_0))}{dOVL} \right\|^2.$$

In the equation above, S may represent the sensor model, OVL may represent the overlay signal, $\mathrm{argmax}_x$ may be an example cost function that is to be maximized, and $x_o$ may be the optimal bottom grating design. A signal strength of the signal from the metrology mark topography may be maximized using this equation, for example. The optimal bottom grating design, $x_o$, may be associated with the maximized signal strength. Argmax may comprise a notation indicating maximization of the expression that follows after argmax, and returning the value of the parameter in the subscript (in this case x) that maximizes that expression. These examples are not intended to be limiting. For example, these same principles may be applied for alignment metrology mark optimization, and/or other designing any other wafer features the undergo deposition, etching, and/or other lithography processes.

Figure 11:
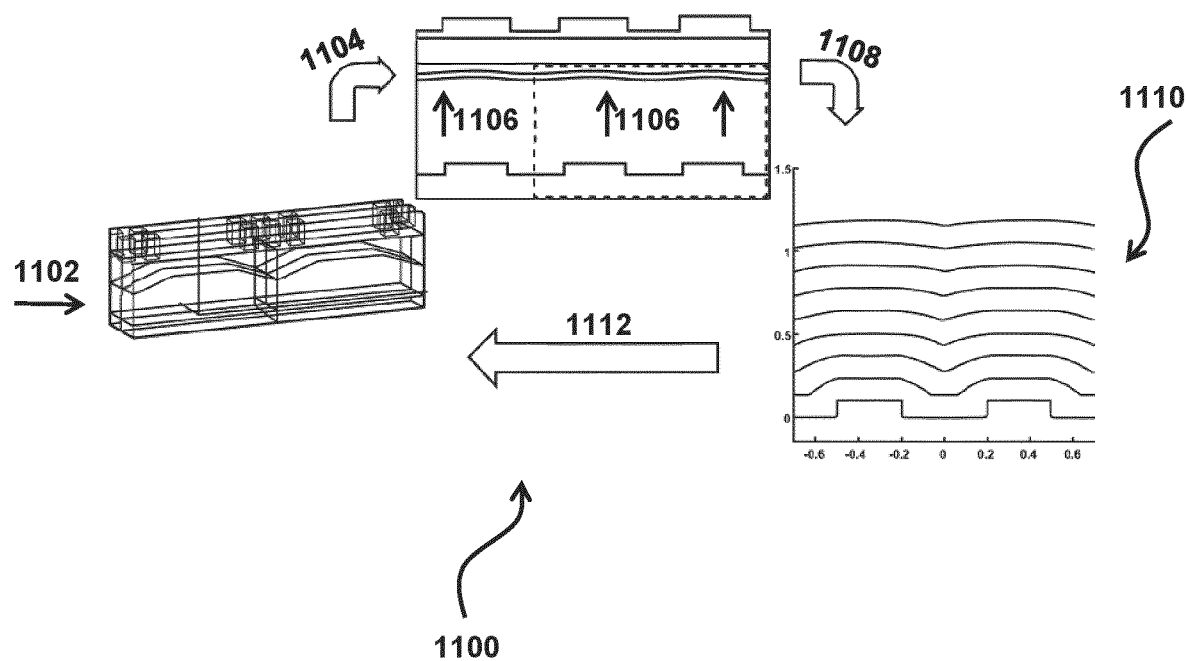
FIG. 11 illustrates a summary of a method for metrology (e.g., alignment, overlay, etc.) target design, according to an embodiment.

FIG. 11 illustrates a summary of a method 1100 for metrology (e.g., alignment, overlay, etc.) target design according to an embodiment of the present disclosure. Wafer layer and/or stack geometry 1102 associated with a metrology mark (and/or other portions of a wafer) may be provided 1104 to a deposition model (e.g., the deposition model described herein) that simulates a deposition process 1106 and predicts 1108 a deposition profile 1110. The deposition model may predict the transferred topography from a bottom grating to a top surface of the wafer layer, for example. The predicted deposition profile 1110 may be provided 1112 to a sensor simulator (e.g., a metrology target design tool) configured to predict a signal strength associated with deposition profile 1110. The geometry of the bottom grating may be adjusted to improve a strength and/or other characteristics of the metrology mark signal, for example. The operations shown in FIG. 11 may be iteratively repeated to improve the metrology mark. The operations shown in FIG. 11 may be iteratively repeated until a stop condition is satisfied, for example. The stop condition may comprise a number of repetitions, a signal strength threshold, a cost associated with the repetitions, a time associated with the repetitions, and/or other conditions. In some embodiments, one or more of the operations shown in FIG. 11 may be performed in real time or near real time during wafer fabrication, for example.

Returning to operation 908 of FIG. 9, in some embodiments, using the predicted deposition profile to determine the deviation of the predicted deposition profile from the target profile caused by asymmetry further comprises using the deviation to predict an asymmetry component of a measured metrology target signal. The deviation may be used to correct for the asymmetry induced scanner offset, and/or for other uses. The correcting may comprise removing the asymmetry component of the measured metrology target signal, for example. In some embodiments, removing the asymmetry component of the measured metrology target signal comprises subtracting the asymmetry component from the measured metrology target signal. In some embodiments, the asymmetry component of the metrology target signal may be predicted based on the deviation of the predicted deposition profile from the target profile.

By way of a non-limiting example, given an initial substrate geometry, the calibrated deposition model is configured to predict a final metrology target geometry after deposition (e.g., a deposition profile), including any possible asymmetries according to the equation:

$$y_{pred} = D(x_0, p_0),$$

where $y_{pred}$ is the predicted geometry after deposition. The predicted target geometry, $y_{pred}$, may be provided to a sensor model as input in order to obtain a predicted asymmetry fingerprint according to the equation:

$$z_{asym} = S(y_{pred}) = S(D(x_0, p_0)),$$

where $z_{asym}$ is the asymmetry fingerprint. The asymmetry fingerprint may be subtracted (for example) from the measured signal, $z_{meas}$, to obtain a corrected signal according to the equation:

$$z_{corr} = z_{meas} - z_{asym},$$

where $z_{corr}$ is the corrected signal. This example is not intended to be limiting, and it should be noted that this approach may be applicable to any asymmetry-sensitive sensor such as an alignment sensor in a scanner, an overlay sensor, and/or other sensors.

Figure 12:
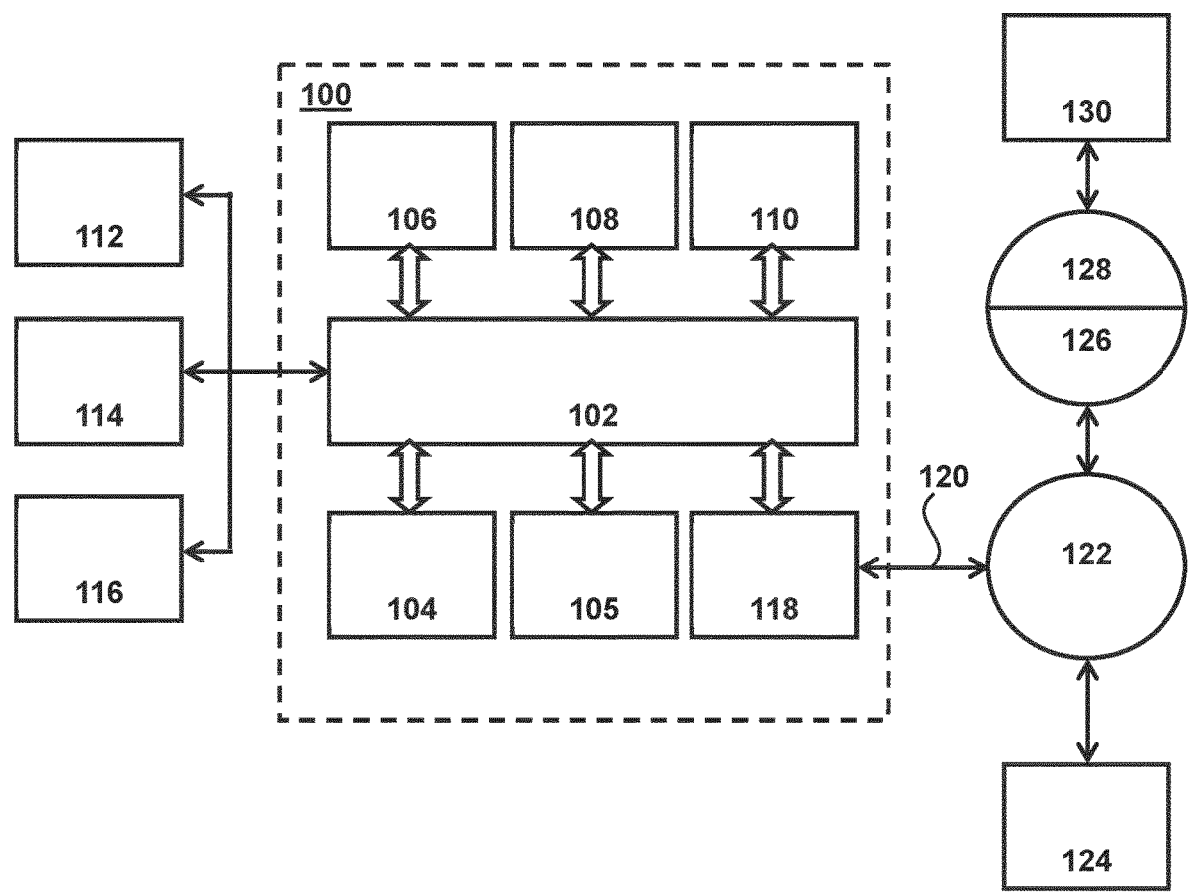
FIG. 12 is a block diagram of an example computer system, according to an embodiment.

FIG. 12 is a block diagram that illustrates a computer system 100 that can assist in implementing the methods, flows or the system(s) disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 13:
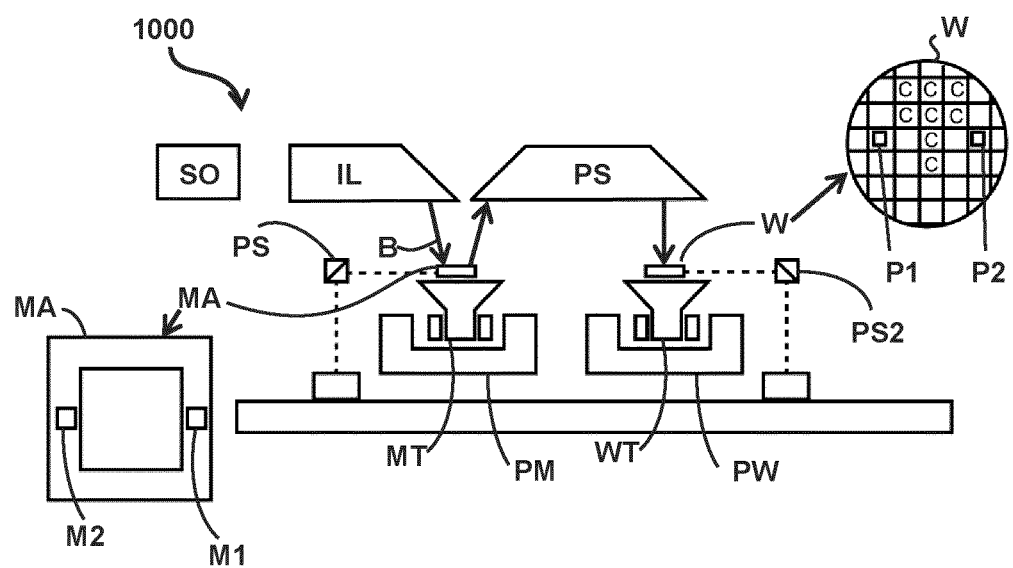
FIG. 13 is a schematic diagram of a lithographic projection apparatus similar to FIG. 1, according to an embodiment.

FIG. 13 schematically depicts an exemplary lithographic projection apparatus similar to and/or the same as the apparatus shown in FIG. 1 that can be used in conjunction with the techniques described herein. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 13 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

The depicted tool can be used in two different modes:
In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 14:
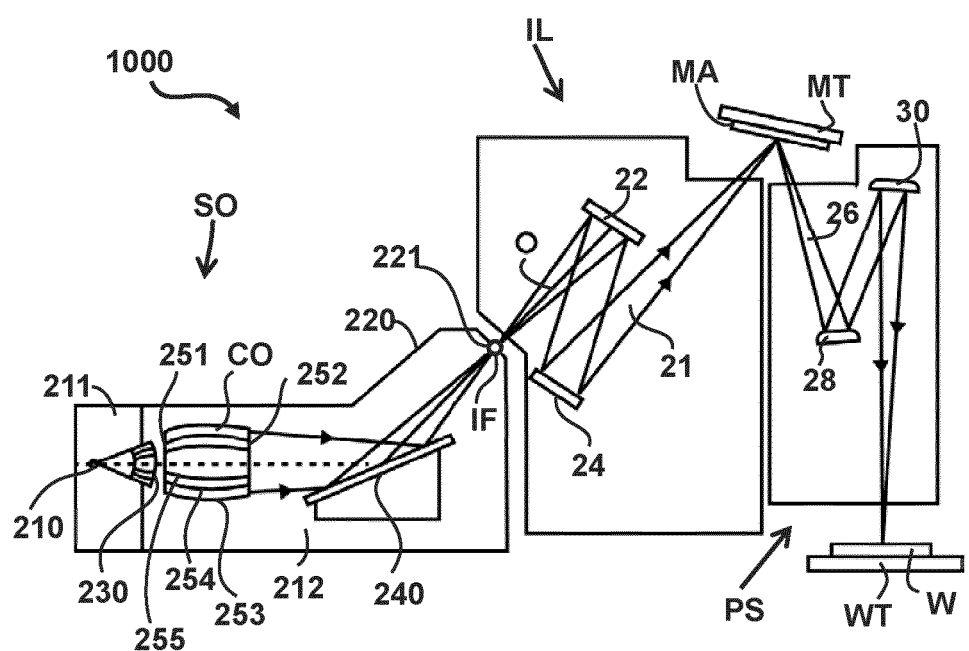
FIG. 14 is a more detailed view of the apparatus in FIG. 13, according to an embodiment.

FIG. 14 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 15:
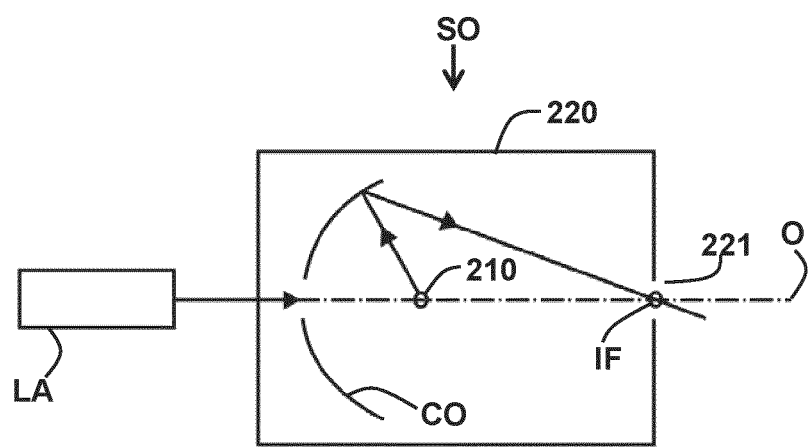
FIG. 15 is a more detailed view of the source collector module SO of the apparatus of FIG. 13 and FIG. 14, according to an embodiment.

Alternatively, the source collector module SO may be part of an LPP radiation system as shown in FIG. 15. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Embodiments of the present disclosure can be further described by the following clauses.

1. A semiconductor manufacturing process modeling method, the method comprising:
    predicting a deposition profile of a substrate based on a deposition model;
    using the predicted deposition profile to enhance a metrology target design;
    predicting one or more photolithography process parameters based on the enhanced metrology target design; and
    determining an adjustment for a photolithography apparatus based on the one or more determined photolithography process parameters.
2. The method of clause 1, wherein the one or more determined photolithography process parameters comprise one or more of overlay or alignment associated with one or more layers of the substrate.
3. The method of clause 2, wherein enhancing the metrology target design comprises adjusting a metrology target design from a first metrology target design to a second metrology target design based on the overlay or the alignment.
4. The method of clause 1, wherein the metrology target design comprises an alignment metrology target design or an overlay metrology target design.
5. The method of clause 1, wherein the predicted deposition profile is used to determine the deviation of the predicted deposition profile from the target profile caused by asymmetry, and wherein the deviation is used to correct for an asymmetry induced scanner offset.
6. The method of clause 1, further comprising adjusting the photolithography apparatus based on the determined adjustment, wherein the adjusting comprises adjusting one or more of a dose, a focus, or a pupil of the photolithography apparatus.
7. The method of clause 6, wherein adjusting one or more of the dose, the focus, or the pupil of the photolithography apparatus comprises one or more of adjusting an intensity of a source beam of radiation, adjusting a position of a projection system lens, or adjusting a size of a projection system aperture to improve a shape of the metrology target design and/or decrease deviation of the predicted deposition profile from a target deposition profile caused by asymmetry.
8. The method of clause 1, further comprising calibrating the deposition model using experimental cross-section profile information from a layer of a physical wafer.
9. The method of clause 1, wherein predicting the deposition profile comprises receiving a pre-deposition substrate profile and deposition recipe parameters, and simulating a deposition process on the pre-deposition substrate profile based on the deposition recipe parameters to generate the predicted deposition profile.
10. The method of clause 1, wherein the asymmetry comprises differences in dimensions of corresponding features across the substrate.
11. A method for applying a deposition model in a semiconductor manufacturing process, the method comprising:
    predicting a deposition profile of a substrate using the deposition model; and
    using the predicted deposition profile to enhance a metrology target design.
12. The method of clause 11, further comprising calibrating the deposition model using experimental cross-section profile information from a layer of a physical wafer.
13. The method of clause 12, wherein the deposition model is a machine-learning model, and calibrating the deposition model comprises training the machine-learning model.
14. The method of clause 12, wherein the experimental cross-section profile information comprises visual or dimensional comparisons between an electronic image of the substrate and a corresponding electronic depiction of the substrate generated using the model.
15. The method of any of clauses 11-14, wherein the metrology target design comprises an alignment metrology target design or an overlay metrology target design.
16. The method of any of clauses 11-15, wherein using the predicted deposition profile to enhance a metrology target design comprises predicting a signal strength of an alignment metrology target design and enhancing the alignment metrology target design based on the predicted signal strength.
17. The method of clause 16, wherein enhancing the alignment metrology target design comprises adjusting one or more dimensions and/or a pattern of the alignment metrology target design and/or adjusting a deposition material to maximize the predicted signal strength.
18. The method of any of clauses 11-15, wherein using the predicted deposition profile to enhance a metrology target design comprises predicting a signal strength of an overlay metrology target design and enhancing the overlay metrology target design based on the predicted signal strength.
19. The method of clause 18, wherein enhancing the overlay metrology target design comprises adjusting one or more dimensions and/or a pattern of the overlay metrology target design and/or adjusting a deposition material to maximize the predicted signal strength.
20. The method of any of clauses 11-19, further comprising using the predicted deposition profile to determine a deviation of the predicted deposition profile from a target profile caused by asymmetry, and using the deviation to predict an asymmetry component of a measured metrology target signal.
21. The method of clause 20, further comprising using the deviation to correct for asymmetry induced scanner offset.
22. The method of clause 21, the correcting comprising removing the asymmetry component of the measured metrology target signal.
23. The method of clause 22, wherein removing the asymmetry component of the measured metrology target signal comprises subtracting the asymmetry component from the measured metrology target signal.

24. The method of any of clauses 20-23, wherein the asymmetry component of the metrology target signal is predicted based on the deviation of the predicted deposition profile from the target profile.

25. The method of clause 11, further comprising predicting overlay and/or alignment based on the enhanced metrology target design.

26. A computer program product comprising a non-transitory computer readable medium having instructions recorded thereon, the instructions when executed by a computer implementing the method of any of clauses 1-25.

27. A semiconductor manufacturing process modeling method, the method comprising:
obtaining a deposition profile of a substrate; and
using the deposition profile to adjust a metrology target design.

28. The method of clause 27, further comprising predicting one or more photolithography process parameters based on the adjusted metrology target design.

29. The method of clause 27, further comprising determining an adjustment for a photolithography apparatus based on the one or more determined photolithography process parameters.

30. The method of clause 27, wherein the obtaining the deposition profile comprises generating a predicted deposition profile by using a deposition model.

31. The method of clause 29, wherein the metrology target design comprises an alignment metrology target design or an overlay metrology target design, and
wherein the one or more determined photolithography process parameters comprise one or more of overlay or alignment associated with one or more layers of the substrate.

32. The method of clause 27, wherein adjusting the metrology target design comprises:
predicting a signal strength of the metrology target design; and
modifying the metrology target design based on the predicted signal strength.

33. The method of clause 32, wherein modifying the metrology target design comprises adjusting one or more dimensions and/or a pattern of the metrology target design and/or adjusting a deposition material to maximize the predicted signal strength.

34. The method of clause 30, wherein the predicted deposition profile is used to determine the deviation of the predicted deposition profile from a target profile caused by asymmetry, and wherein the deviation is used to correct for an asymmetry induced scanner offset.

35. The method of clause 29, wherein the determined adjustment comprises adjustment of one or more of a dose, a focus, or a pupil of the photolithography apparatus, wherein the adjustment of one or more of the dose, the focus, or the pupil of the photolithography apparatus comprises adjustment of one or more of an intensity of a source beam of radiation, adjusting a position of a projection system lens, or adjusting a size of a projection system aperture to improve a shape of the metrology target design and/or decrease deviation of the predicted deposition profile from a target deposition profile caused by asymmetry.

36. The method of clause 30, wherein the generating the predicted deposition profile comprises calibrating the deposition model using experimental cross-section profile information from a process layer of a physical wafer.

37. The method of clause 30, wherein generating the predicted deposition profile comprises receiving a pre-deposition substrate profile and deposition recipe parameters, and simulating a deposition process on the pre-deposition substrate profile based on the deposition recipe parameters to generate the predicted deposition profile.

38. The method of clause 34, wherein the asymmetry comprises differences in dimensions of corresponding features across the substrate.

39. The method of clause 36, wherein the deposition model is a machine-learning model, and calibrating the deposition model comprises training the machine-learning model.

40. The method of clause 30, further comprising using the predicted deposition profile to determine a deviation of the predicted deposition profile from a target profile caused by asymmetry, and using the deviation to predict an asymmetry component of a measured metrology target signal, and correcting the asymmetry induced scanner offset, wherein the correcting comprises removing the asymmetry component of the measured metrology target signal.

41. The method of clause 27, wherein adjust the metrology target design comprises simulating response of overlay or alignment measurement signal or other scanner mark signal.

42. A computer program product comprising a non-transitory computer readable medium having instructions recorded thereon, the instructions when executed by a computer implementing the method of any of clauses 27-41.

The disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the disclosed herein may be used for imaging on a substrate such as a silicon wafer, it shall be understood that the disclosed invention may be used with any type of lithographic imaging systems, e.g., those used for imaging on substrates other than silicon wafers. In addition, the combination and sub-combinations of disclosed elements may comprise separate embodiments. For example, using the predicted deposition profile to (1) enhance a metrology target design, and/or (2) determine a deviation of the predicted deposition profile from a target profile caused by asymmetry may comprise separate embodiments, and/or these features may be used together in the same embodiment.

The descriptions above are intended to be illustrative, not limiting. Thus, it will be apparent to one skilled in the art that modifications may be made as described without departing from the scope of the claims set out below.

What is claimed is:

1. A method comprising:
obtaining a predicted deposition profile of a substrate, wherein the obtaining comprises generating the predicted deposition profile by using a deposition model and the predicted deposition profile represents a topography on a surface of a deposited layer caused by a structure buried by the deposited layer; and
using the deposition profile to adjust a metrology target design, wherein the using comprises simulating a response of an overlay or alignment measurement signal or other photolithography apparatus metrology mark signal.

2. The method of claim 1, further comprising predicting one or more photolithography process parameters based on the adjusted metrology target design.

3. The method of claim 2, further comprising determining an adjustment for a photolithography apparatus based on the one or more determined photolithography process parameters.

4. The method of claim 1, wherein using the deposition profile to adjust the metrology target design comprises:
predicting a measurement signal strength of the metrology target design; and
modifying the metrology target design based on the predicted signal strength.

5. The method of claim 4, wherein modifying the metrology target design comprises adjusting one or more dimensions and/or a pattern of the metrology target design and/or adjusting a deposition material to maximize the predicted signal strength.

6. The method of claim 1, wherein the predicted deposition profile is used to determine a deviation of the predicted deposition profile from a target profile caused by asymmetry, and wherein the deviation is used to correct for an asymmetry induced photolithography apparatus offset.

7. A computer program product comprising a non-transitory computer-readable medium having instructions therein, the instructions, when executed by a computer system, configured to cause the computer system to at least:
generate a predicted deposition profile of a substrate by use of a deposition model, the predicted deposition profile representing a topography on a surface of a deposited layer caused by a structure buried by the deposited layer; and
use the deposition profile to adjust a metrology target design.

8. The computer program product of claim 7, wherein the instructions are further configured to cause the computer system to predict one or more photolithography process parameters based on the adjusted metrology target design.

9. The computer program product of claim 8, wherein the instructions are further configured to cause the computer system to determine an adjustment for a photolithography apparatus based on the one or more determined photolithography process parameters.

10. The computer program product of claim 9, wherein the determined adjustment comprises adjustment of one or more selected from: a dose, a focus, or a pupil of the photolithography apparatus, wherein the adjustment of one or more selected from the dose, the focus, or the pupil comprises adjustment of one or more selected from: an intensity of a source beam of radiation, a position of a projection system lens, or a size of a projection system aperture, to improve a shape of the metrology target design and/or decrease deviation of the predicted deposition profile from a target deposition profile caused by asymmetry.

11. The computer program product of claim 8, wherein the metrology target design comprises an alignment metrology target design or an overlay metrology target design, and wherein the one or more determined photolithography process parameters comprise overlay and/or alignment, associated with one or more layers of the substrate.

12. The computer program product of claim 7, wherein the instructions configured to cause the computer system to use the deposition profile to adjust a metrology target design are further configured to cause the computer system to:
predict a measurement signal strength of the metrology target design; and
modify the metrology target design based on the predicted signal strength.

13. The computer program product of claim 12, wherein the instructions configured to cause the computer system to modify the metrology target design are further configured to cause the computer system to adjust one or more dimensions and/or a pattern of the metrology target design and/or adjust a deposition material to maximize the predicted signal strength.

14. The computer program product of claim 7, wherein the predicted deposition profile is used to determine a deviation of the predicted deposition profile from a target profile caused by asymmetry, and wherein the deviation is used to correct for an asymmetry induced photolithography apparatus offset.

15. The computer program product of claim 14, wherein the asymmetry comprises differences in dimensions of corresponding features across the substrate.

16. The computer program product of claim 7, wherein the instructions configured to cause the computer system to generate the predicted deposition profile are further configured to cause the computer system to calibrate the deposition model using experimental cross-section profile information from a process layer of a physical substrate.

17. The computer program product of claim 16, wherein the deposition model is a machine-learning model, and wherein the instructions configured to cause the computer system to calibrate the deposition model are further configured to cause the computer system to train the machine-learning model.

18. The computer program product of claim 7, wherein the instructions configured to cause the computer system to generate the predicted deposition profile are further configured to cause the computer system to:
receive a pre-deposition substrate profile and one or more deposition recipe parameters; and
simulate a deposition process on the pre-deposition substrate profile based on the one or more deposition recipe parameters to generate the predicted deposition profile.

19. The computer program product of claim 7, wherein the instructions are further configured to cause the computer system to:
use the predicted deposition profile to determine a deviation of the predicted deposition profile from a target profile caused by asymmetry;
use the deviation to predict an asymmetry component of a measured metrology target signal; and
correct an asymmetry induced photolithography apparatus offset to remove at least part of the asymmetry component of the measured metrology target signal.

20. The computer program product of claim 7, wherein the instructions configured to cause the computer system to use the deposition profile to adjust a metrology target design are further configured to cause the computer system to simulate response of an overlay or alignment measurement signal or other photolithography apparatus metrology mark signal.

* * * * *